United States Patent
Park et al.

(10) Patent No.: US 9,018,610 B2
(45) Date of Patent: Apr. 28, 2015

(54) RESISTIVE MEMORY DEVICE AND METHOD OF MANUFACTURING THE SAME

(75) Inventors: Nam Kyun Park, Gyeonggi-do (KR); Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 308 days.

(21) Appl. No.: 13/483,462

(22) Filed: May 30, 2012

(65) Prior Publication Data

US 2013/0153847 A1 Jun. 20, 2013

(30) Foreign Application Priority Data

Dec. 15, 2011 (KR) .................. 10-2011-0135699

(51) Int. Cl.
| H01L 47/00 | (2006.01) |
| H01L 27/06 | (2006.01) |
| H01L 27/10 | (2006.01) |
| H01L 27/22 | (2006.01) |
| H01L 27/24 | (2006.01) |
| H01L 45/00 | (2006.01) |

(52) U.S. Cl.
CPC .......... *H01L 27/0688* (2013.01); *H01L 27/101* (2013.01); *H01L 45/04* (2013.01); *H01L 45/06* (2013.01); *H01L 45/1226* (2013.01); *H01L 45/126* (2013.01); *H01L 45/147* (2013.01); *H01L 27/228* (2013.01); *H01L 27/2436* (2013.01); *H01L 27/2472* (2013.01); *H01L 27/249* (2013.01)

(58) Field of Classification Search
USPC ...................... 257/2, 4; 365/185.17
See application file for complete search history.

(56) References Cited

U.S. PATENT DOCUMENTS

2009/0218558 A1* 9/2009 Park et al. .................. 257/4

FOREIGN PATENT DOCUMENTS

KR       1020050110680       11/2005

* cited by examiner

*Primary Examiner* — Samuel Gebremariam
(74) *Attorney, Agent, or Firm* — IP & T Group LLP

(57) ABSTRACT

A resistive memory device capable of improving an integration density is provided. The resistive memory device includes a semiconductor substrate, a plurality of resistive memory cells configured to be stacked on the semiconductor substrate and insulated from one another, where each of the plurality of resistive memory cells includes a switching transistor and a resistive device layer electrically connected to the switching transistor, a common source line electrically connected to the plurality of stacked resistive memory cells, and a bit line electrically connected to the plurality of stacked resistive memory cells and being insulated from the common source line.

24 Claims, 17 Drawing Sheets

RESISTIVE MEMORY DEVICE AND METHOD OF MANUFACTURING THE SAME

CROSS-REFERENCES TO RELATED APPLICATION

The present application claims priority under 35 U.S.C. 119(a) to Korean application number 10-2011-0135699, filed on Dec. 15, 2011, in the Korean Patent Office, which is incorporated by reference in its entirety as if set forth in full.

BACKGROUND OF THE INVENTION

1. Technical Field

Exemplary embodiments of the present invention relate to a semiconductor integrated circuit device and a method of manufacturing the same, and more particularly, to a stack type resistive memory device and a method of manufacturing the same.

2. Related Art

With rapid development of a mobile and digital information communication industry and an appliance industry, existing electron charge control-based devices are reaching their physical limits. Thus, different types of memory devices are being developed. For example, next-generation memory devices with large capacity, high speed, and low power consumption are desirable in order to increase the memory capacity of various devices.

Currently, resistive memory devices useable as a memory medium have been suggested as the next-generation memory devices. Exemplary resistive memory devices are phase-change memory devices, resistive memory devices, and magnetoresistive memory devices.

Each of the resistive memory devices is basically constituted of a switching device and a resistive device and stores data "0" or "1" according to a state of the resistive device.

Here, it is desirable to increase an integration density of the resistive memory devices and thus increase the memory capacity within a confined space.

SUMMARY

According to an exemplary embodiment, a resistive memory device includes a semiconductor substrate; a plurality of resistive memory cells configured to be stacked on the semiconductor substrate and insulated from one another, wherein each of the plurality of resistive memory cells includes a switching transistor and a resistive device layer electrically connected to the switching transistor; a common source line electrically connected to the plurality of stacked resistive memory cells; and a bit line electrically connected to the plurality of stacked resistive memory cells and being insulated from the common source line.

According to another exemplary embodiment, a resistive memory device includes a semiconductor substrate; a pair of first resistive memory cells formed on the semiconductor substrate; a first interlayer insulating layer formed on the pair of first resistive memory cells; a pair of second resistive memory cells formed on the first interlayer insulating layer at positions above the pair of first resistive memory cells; a common source line electrically connected to the first and second resistive memory cells; and a bit line electrically connected to the first and second resistive memory cells. Each of the first and second resistive memory cells includes a switching transistor and a resistive device layer connected to the switching transistor.

According to still another exemplary embodiment, a method of manufacturing a resistive memory device is provided. The method includes forming a first active layer on a semiconductor substrate; forming a first switching transistor and a resistive device layer in the first active layer; forming a first interlayer insulating layer on a structure including the first active layer; forming a second active layer on the first interlayer insulating layer; forming a second switching transistor and a resistive device layer in the second active layer; forming a common source line to be in contact with source regions of the first and second switching transistors; forming a second interlayer insulating layer on a structure including the common source line; forming a bit line contact unit to be in contact with the resistive device layers; and forming a bit line on the second interlayer insulating layer to be connected to the bit line contact unit.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
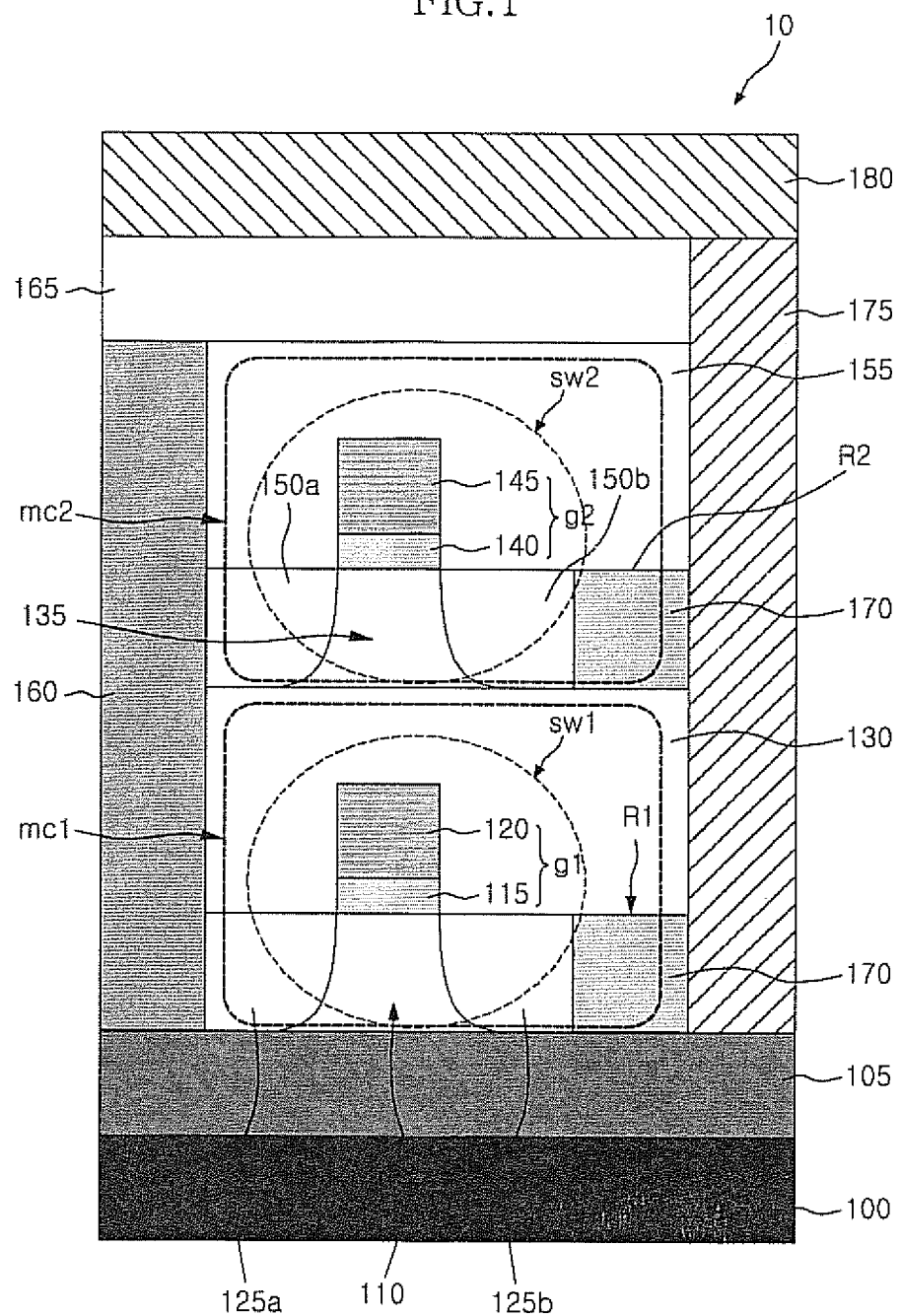
FIG. 1 is a cross-sectional view illustrating a resistive memory device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

As shown in FIG. 1, a resistive memory device 10 according to an exemplary embodiment includes a first memory cell mc1 including a first switch transistor SW1 and a first resistive device R1 and a second memory cell mc2 including a second switching transistor SW2 and a second resistive device R2, where the first and second memory cells mc1 and mc2 are stacked with an insulating layer 130 interposed therebetween.

The first and second switching transistors SW1 and SW2 may be MOS transistors and the first and second resistive devices R1 and R2 (170) are formed to be electrically connected to junction regions of the first and second switching transistors SW1 and SW2, for example, drain regions 125b and 150b.

The stacked first and second resistive devices R1 and R2 may be commonly connected to the a bit line 180 by a bit line contact unit 175 which extends perpendicularly to a surface of a semiconductor substrate 100. Sources regions 125a and 150a of the stacked first and second switching transistors SW1 and SW2 are electrically connected to a source common line 160 which extends perpendicular to the surface of the semiconductor substrate 100.

The reference numerals 105, 130, 155 and 165 denote interlayer insulating layers, and the reference numerals 120 and 145 denote gate electrode layers. In addition, the reference numerals g1 and g2 denote gate electrode structures including gate insulating layers.

The resistive memory device according to the exemplary embodiment has a structure in which the memory cells mc1 and mc2 are stacked so that a plurality of memory cells can be integrated in a confined area.

Although it will be described in detail later, in the exemplary embodiment, the gate electrodes g1 and g2 of the first and second switching transistors SW1 and SW2 are formed to surround upper surfaces and lateral surfaces of the first active layers 110 and 135 having line shapes. Thereby, effective channel lengths of the first and second switching transistors SW1 and SW2 become longer to improve a current driving characteristic.

FIGS. 2 to 9 are cross-sectional views illustrating a method of manufacturing a stack type resistive memory device according to an exemplary embodiment and FIGS. 10 to 15 are plan views illustrating a method of manufacturing a stack type resistive memory device according to an exemplary embodiment.

Figure 2:
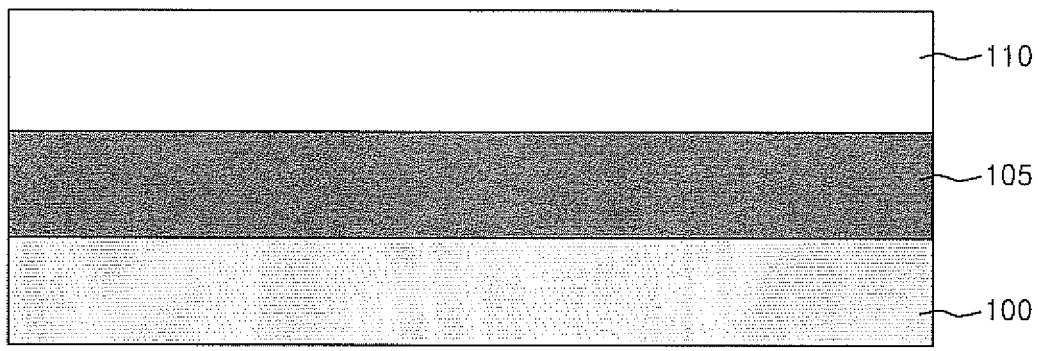
FIGS. 2 to 9 are cross-sectional views illustrating a method of manufacturing a resistive memory device according to an exemplary embodiment of the inventive concept.
Figure 10:
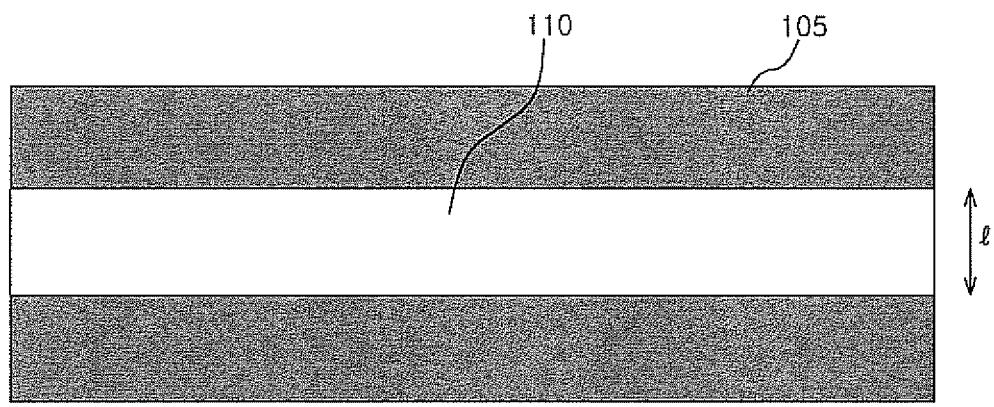
FIGS. 10 to 15 are plan views illustrating a method of manufacturing a resistive memory device according to an exemplary embodiment of the inventive concept.

Referring to FIGS. 2 and 10, an insulating layer 105 is formed on a semiconductor substrate 100. A first active layer 110 having a line shape is formed on the insulating layer 105. Here, a linewidth of the first active layer 110 determines a width of the switching transistor (SW1 of FIG. 1), where the first active layer 110 may include a conductive material including silicon (Si) (for example, a doped polysilicon layer).

Figure 3:
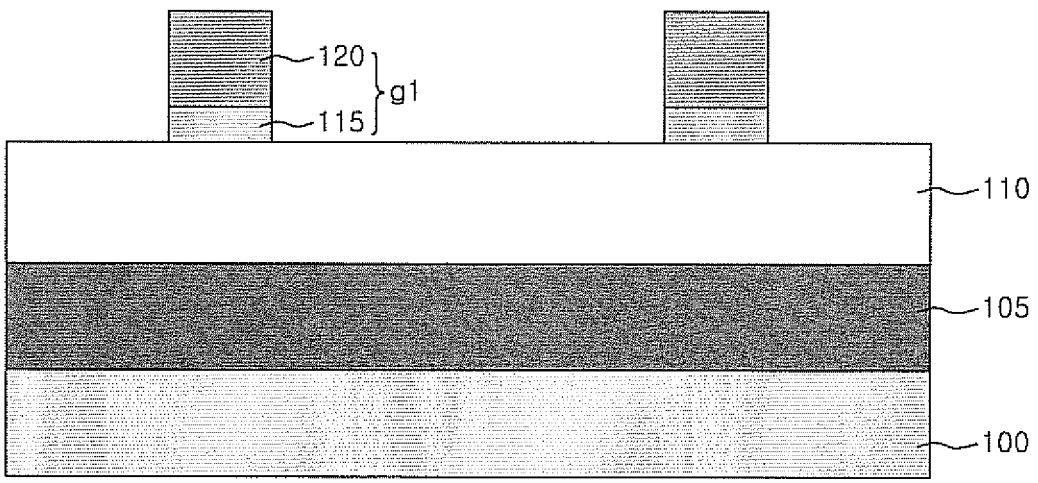
Figure 11:
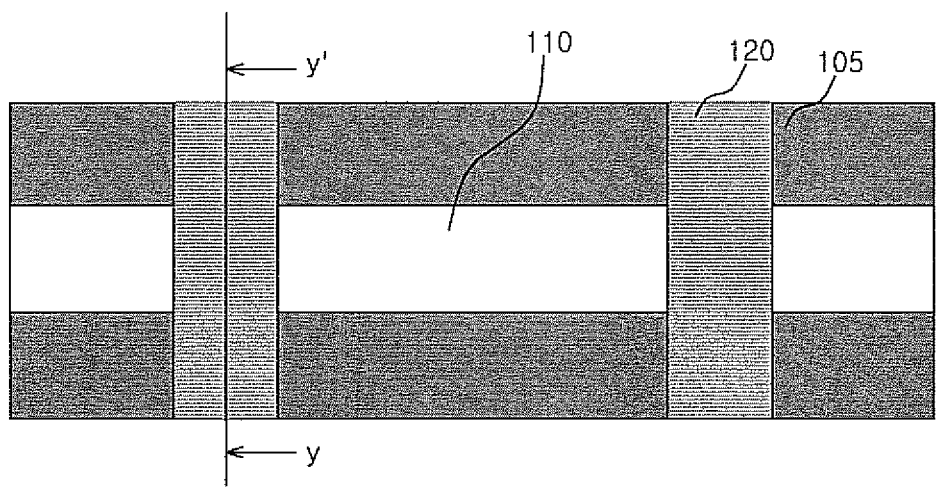
Figure 16:
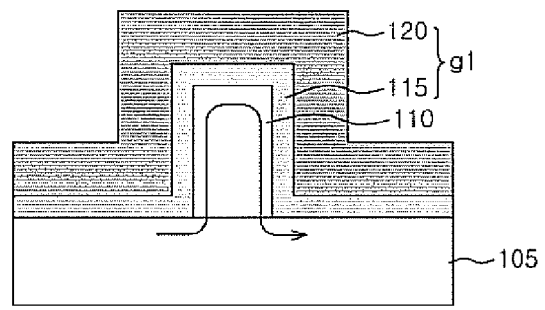
FIG. 16 is a cross-sectional view of a resistive memory device taken along line y-y' of FIG. 11.

Referring to FIGS. 3 and 11, a first gate insulating layer 115 and a first gate electrode layer 120 are sequentially stacked on the first active layer 110 and patterned to form a first gate electrode g1 so that the first gate electrode layer 120 and the first gate insulating layer 115 cross the first active layer 110. In the plan view of FIG. 11, although the first gate electrode g1 crosses the first active layer 110, as shown in FIG. 16, the first gate electrode g1 may be formed to surround three surfaces of the first active layer 110. Therefore, an effective channel length of the switching transistor can be increased.

Although a plurality of first gate electrodes g1 may be formed on the first active layer 110, in the exemplary embodiment, for illustration purposes, only a pair of gate electrodes g1 is described.

The first gate insulating layer 115 may be a silicon oxide layer or a metal oxide layer. The first gate electrode layer may include any one selected from the group consisting of a metal layer such as tungsten (W), copper (Cu), titanium (Ti), molybdenum (Mo) and tantalum (Ta), a metal nitride layer such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN) and tantalum aluminum nitride (TaAlN), a metal silicide layer such as titanium silicide (TiSi), an heterometal layer such as titanium tungsten (TiW), and a metal oxynitride layer such as a titanium oxynitride (TiON), tungsten oxynitride (WON), and tantalum oxynitride (TaON).

Figure 4:
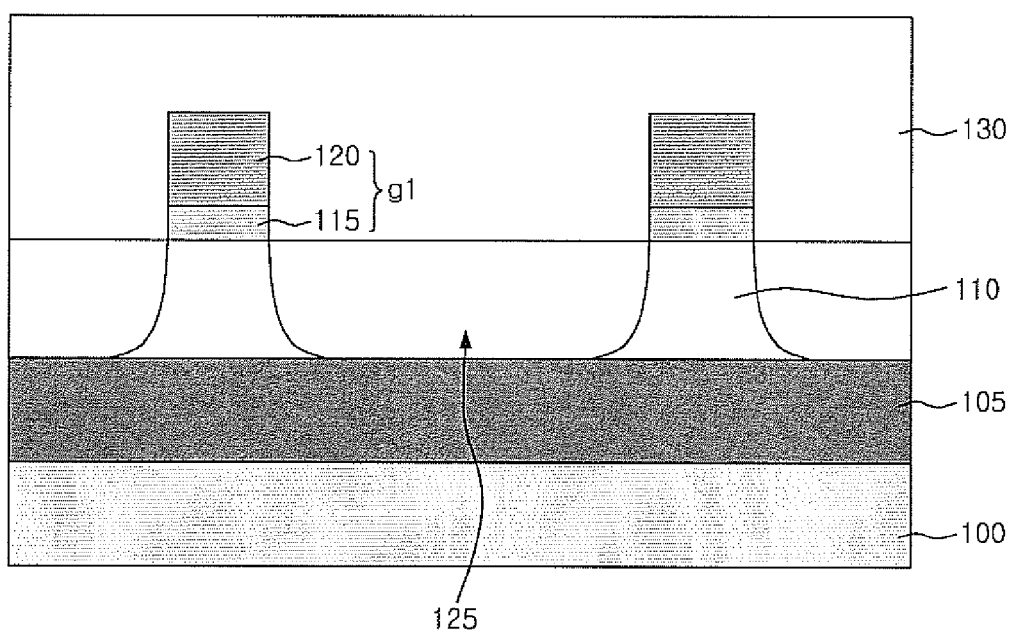

Referring to FIG. 4, impurities are implanted in the first active layer 110 at both sides of each first gate electrode g1 to form first junction layers 125. Here, among the first junction regions 125, a first junction region 125 arranged between the first gate electrodes g1 may be a drain region 125b of a MOS transistor as described later and a junction region 125 arranged at the opposite side of each of the first gate electrodes g1 may be a source region 125a of the MOS transistor. Therefore, the first switching transistor SW1 is formed. Next, a first interlayer insulating layer 130 is formed on a resultant structure of the semiconductor substrate 100.

Figure 5:
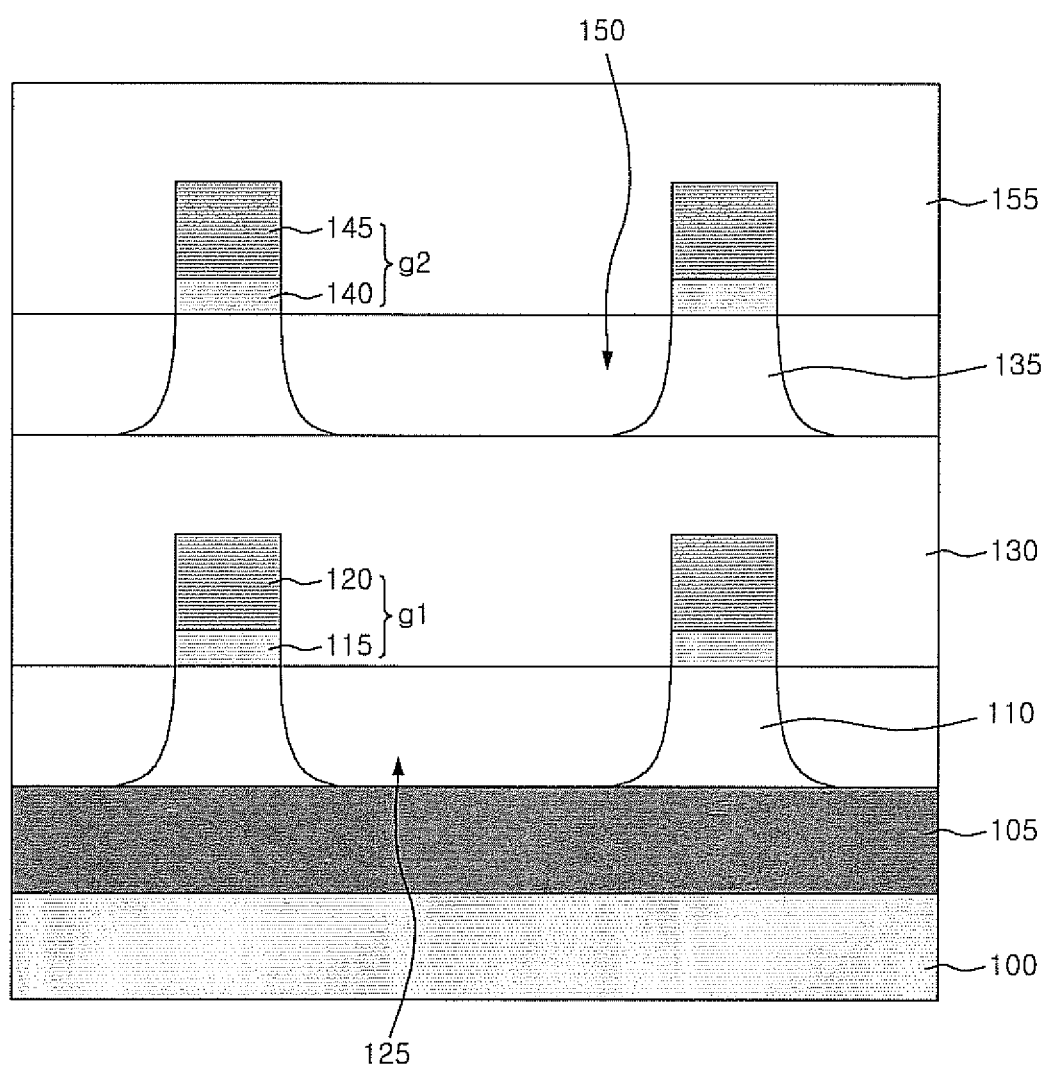
Figure 12:
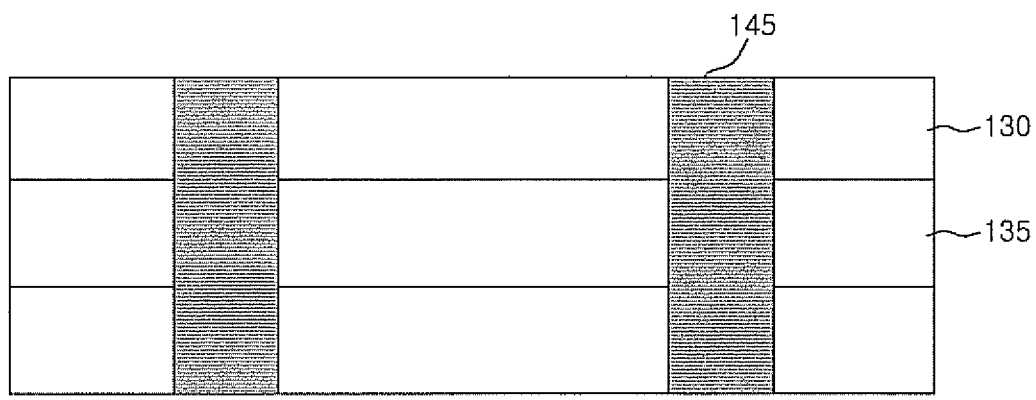

Referring to FIGS. 5 and 12, a second active layer 135 is formed on the first interlayer insulating layer 130, and a second gate insulating layer 140 and a second gate electrode layer 145 are sequentially stacked. The second gate electrode layer 145 may include the same material as the first gate electrode layer 120. The second gate electrode layer 145 and the second gate insulating layer 140 are patterned to form a second gate electrode g2 so that the second gate electrode g2 is arranged at a position corresponding to the first gate electrode g1. Like the first gate electrode g1, the second gate electrode g2 may be formed to surround an upper surface and lateral surfaces of the second active layer 135. In addition, a plurality of second gate electrodes g2 may be formed on the second active layer 135. Impurities are implanted into the second active layer 135 using the second gate electrode g2 as a mask to form second junction regions 150. Similarly, among the second junction regions 150, a second junction region 150 arranged between the second gate electrodes g2 may be a drain region 150b of a MOS transistor as described later and a second junction region 150 arranged at the opposite side of each of the gate electrodes g2 may be source regions 150a of the MOS transistor. Therefore, a second switching transistor SW2 is formed on the second active layer 135. Subsequently, a second interlayer insulating layer 155 is formed on a resultant structure of the semiconductor substrate 100.

Figure 6:
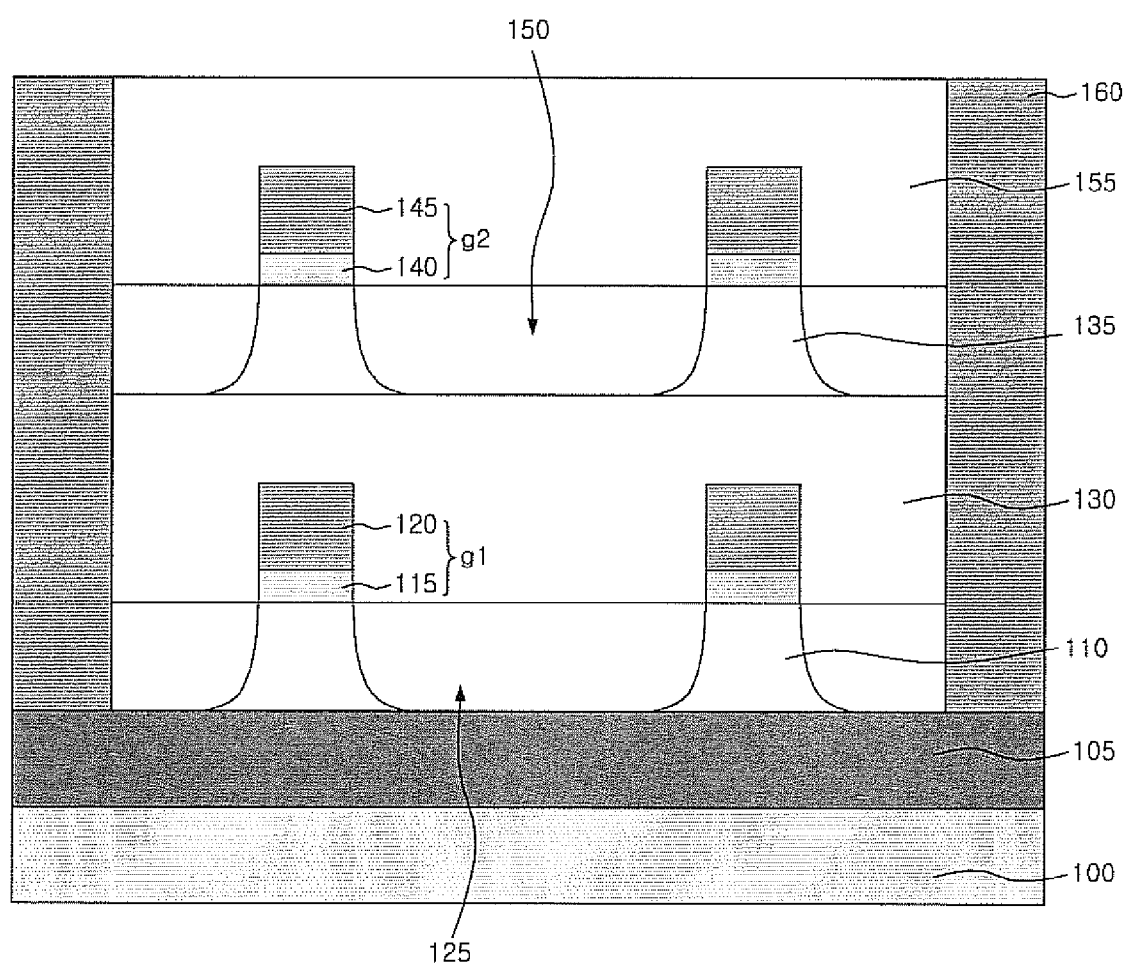
Figure 13:
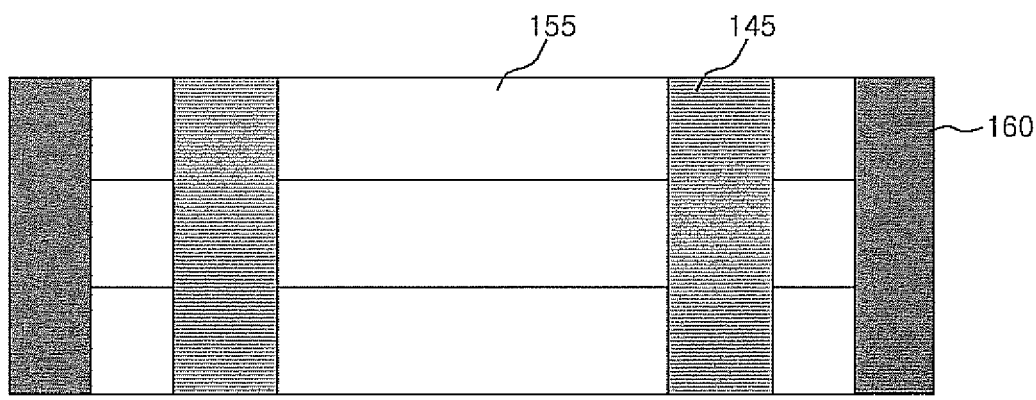

Referring to FIGS. 6 and 13, a common source line 160 is formed to be electrically connected to the first and second junction regions 125 and 150 arranged at the outer sides of the first and second gate electrodes g1 and g2, that is, the source regions 125a and 150a. More specifically, the second interlayer insulating layer 155, the second active layer 135, the first interlayer insulating layer 130, the first active layer 110, the insulating layer 105, and the semiconductor substrate 100 are etched to expose the first and second junction regions 125 and 150 corresponding to the source regions 125a and 150a, thereby forming a contact hole (not shown). The first and second source regions 125a and 150a are exposed through a sidewall of the first contact hole and a conductive material fills the first contact hole, thereby forming the common source line 160 being in contact with the first and second source regions 125a and 150a. The common source line 160 may include any one of materials constituting the first gate electrode 120.

Figure 7:
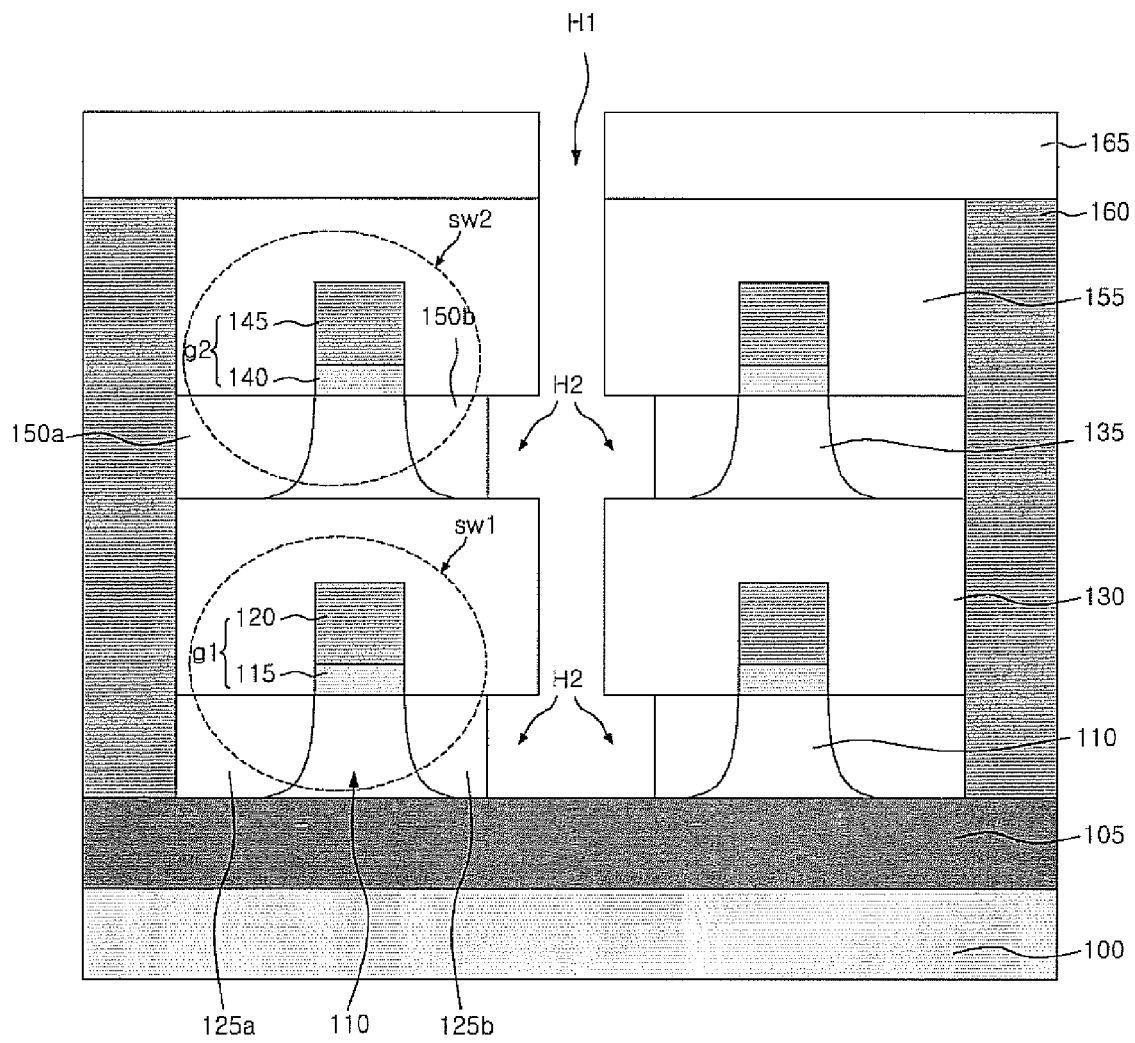

Referring to FIG. 7, a third interlayer insulating layer 165 is formed on a resultant structure of the semiconductor substrate 100 in which the common source line 160 is formed. Next, the third interlayer insulating layer 165, the second interlayer insulating layer 155, the second junction region 150, the first interlayer insulating layer 130, and the first junction region 125 are etched to separate junction regions 125 and 150 between the gate electrodes g1 and g2, which are arranged to be adjacent to one another on the same layer, that is, into the drain regions 125b and 150b for switching transistors, thereby forming a second contact hole H1. By the formation of the second contact hole H1, the drain regions 125b and 150b may be separated into the drain regions of the switching transistors and exposed through a sidewall of the second contact hole H1.

After the second contact hole H1 is formed, an additional overetching process is performed to pull back the drain regions 125b and 150b toward the gate electrodes g1 and g2 by a predetermined length. The pull-back process may be performed by a selective anisotropic etching method and a groove H2 exposing the drain regions 125b and 150b is formed in a predetermined portion of a sidewall of the second contact hole H1 by the pull-back process.

Figure 8:
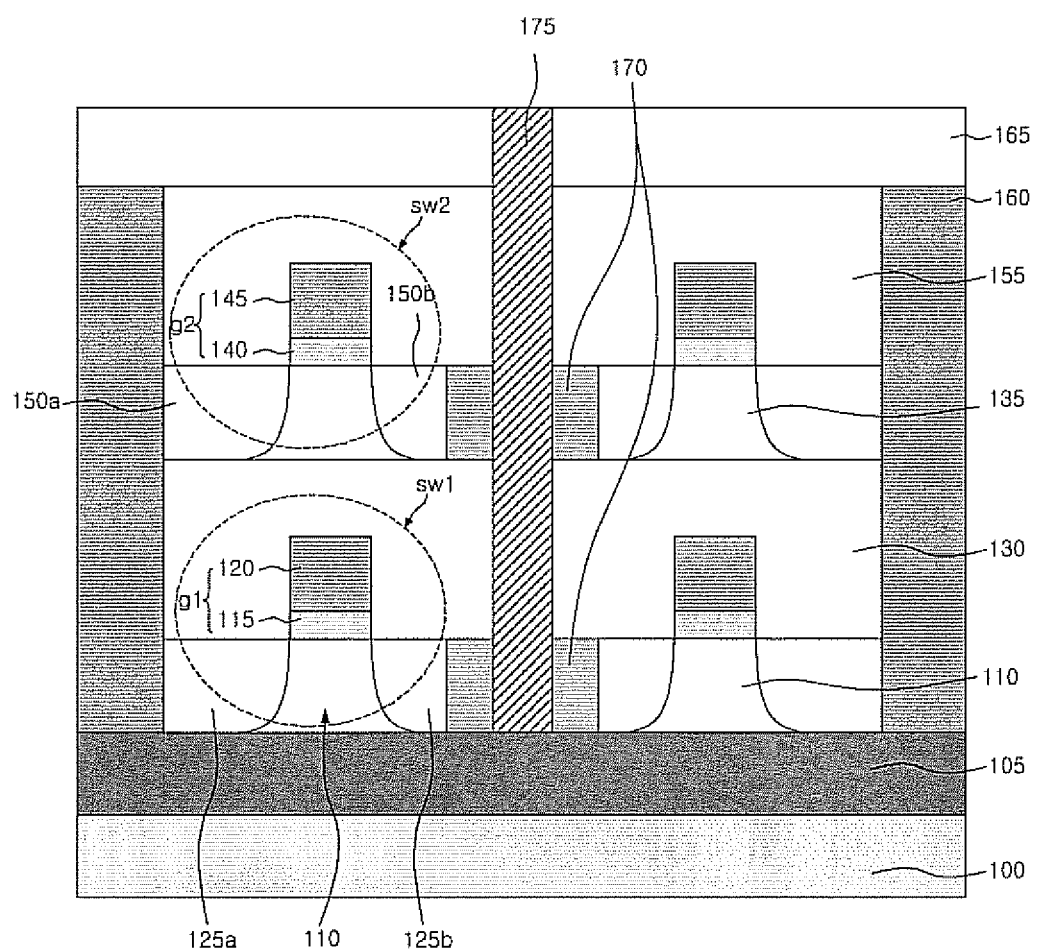
Figure 9:
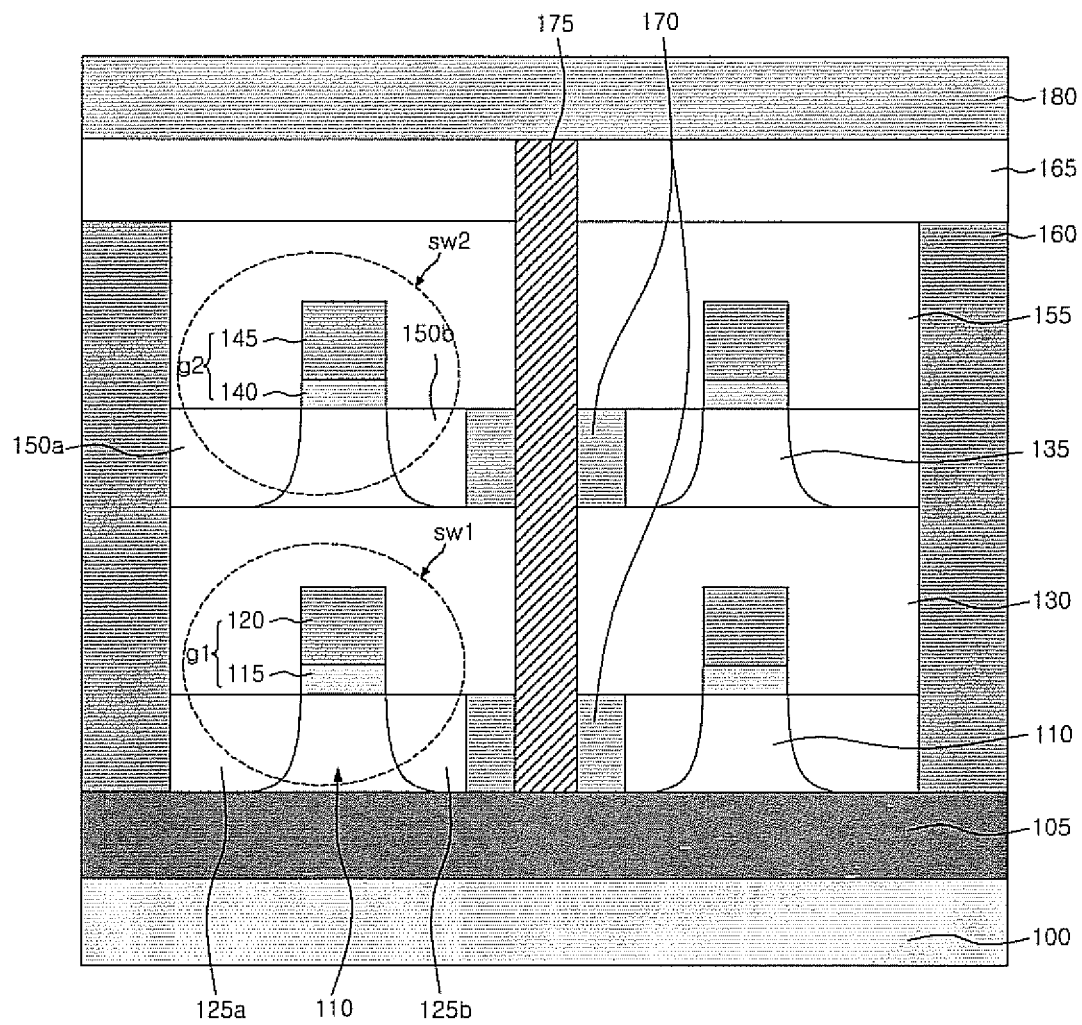
Figure 14:
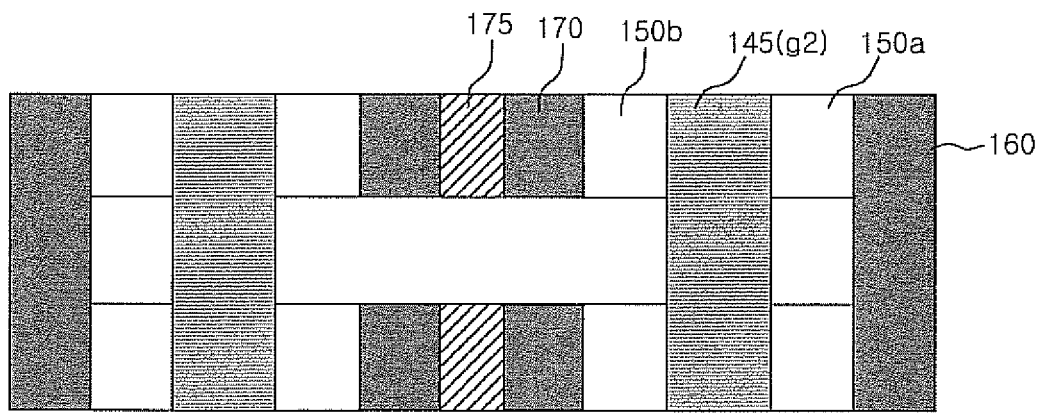

Referring to FIGS. 8 and 14, a resistive device layer 170 buries the groove H2. The resistive device layer 170 may include any one selected from the group consisting of a praseodymium calcium manganese oxide (PCMO) layer which is a material for a resistive to random access memory (ReRAM), a chalcogenide layer which is a material for a phase-change random access memory (PCRAM), a magnetic layer which is a material for a magnetic random access memory (MRAM), a magnetization switching device layer which is a material for a spin-transfer torque MRAM (STT-MRAM), and a polymer layer which is a material for a polymer random access memory (PoRAM). Thereby, a plurality of unit memory cells are formed in each layer and each of the plurality of unit memory cells is constituted of the switching transistor SW1 and SW2 and the resistive device layer 170 connected to the switching transistor SW1 and SW2. Next, a conductive layer buries the second contact hole H1 to form a bit line contact unit 175 which is in contact with the resistive device layer 170. The bit line contact unit 175 may have a plug shape and include any one of the materials constituting the first gate electrode 120.

Figure 15:
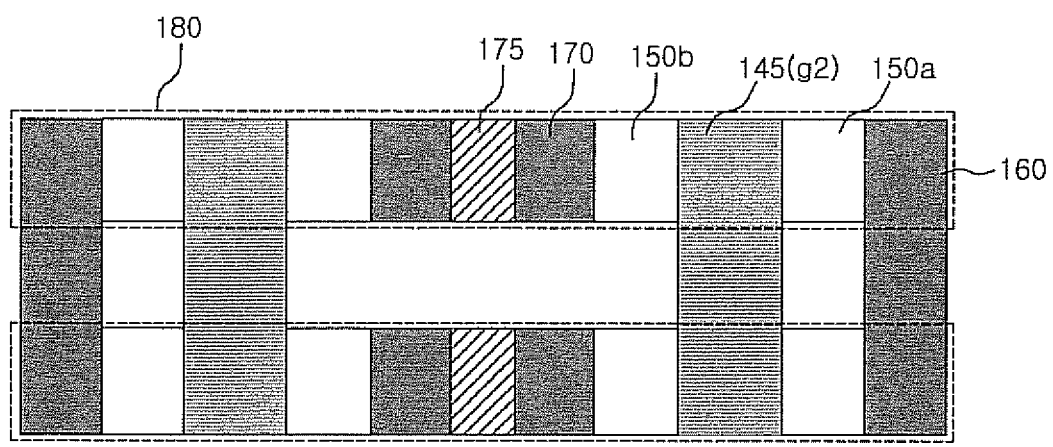

Referring to FIGS. 1 and 15, a bit line 180 electrically connected to the bit line contact unit 175 is formed on the third interlayer insulating layer 165. The bit line 180 may be formed to overlap the first and second active layers 110 and 135 and be arranged in a perpendicular direction to the gate electrodes g1 and g2.

The resistive memory device according to the exemplary embodiment is configured to stack the memory cells mc1 and mc2, each of which is constituted of the switching transistor SW1 and SW2 and the resistive layer 170. Therefore, a high integration memory device can be manufactured by stacking the plurality of cells without being restricted by a critical dimension (CD).

In addition, in the exemplary embodiment, the gate electrodes g1 and g2 of the switching transistors SW1 and SW2 are formed to surround the three surfaces of the active layers 110 and 135. Therefore, the effective channel lengths are increased so that current characteristics of the switching transistors can be improved and the fabrication process can be simple.

Figure 17:
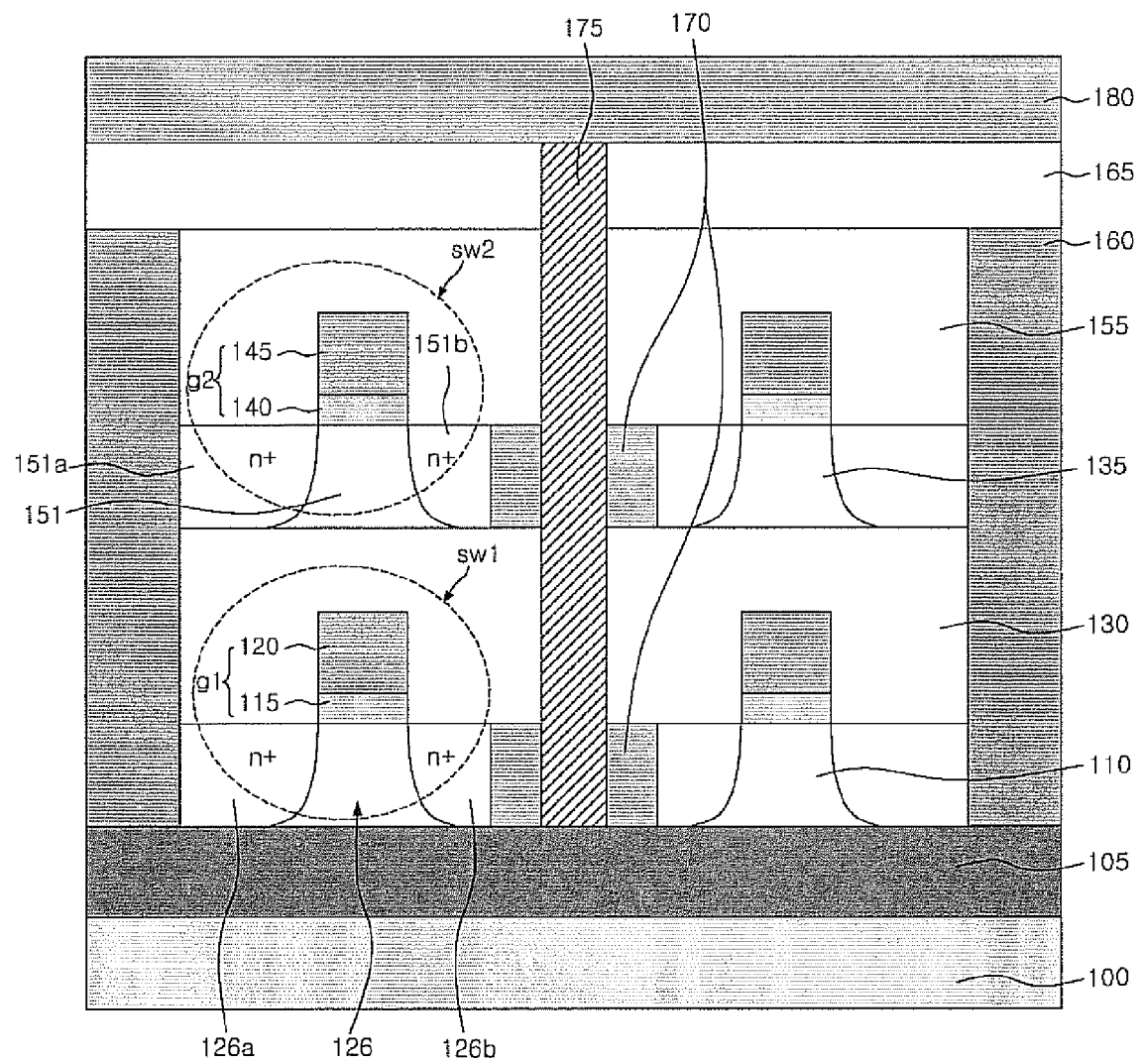
FIGS. 17 to 22 are cross-sectional views illustrating resistive memory devices according to another exemplary embodiment of the inventive concept.

FIGS. 17 to 20 are cross-sectional views illustrating resistive memory devices according to other exemplary embodiments. Referring to FIG. 17, switching transistors SW1 and SW2 may include n-channel MOS transistors. That is, source regions 126a and 151a and drain regions 126b and 151b may include n type impurities and may be formed in first and second active layers 110 and 135 as n type high concentration impurity regions.

Figure 18:
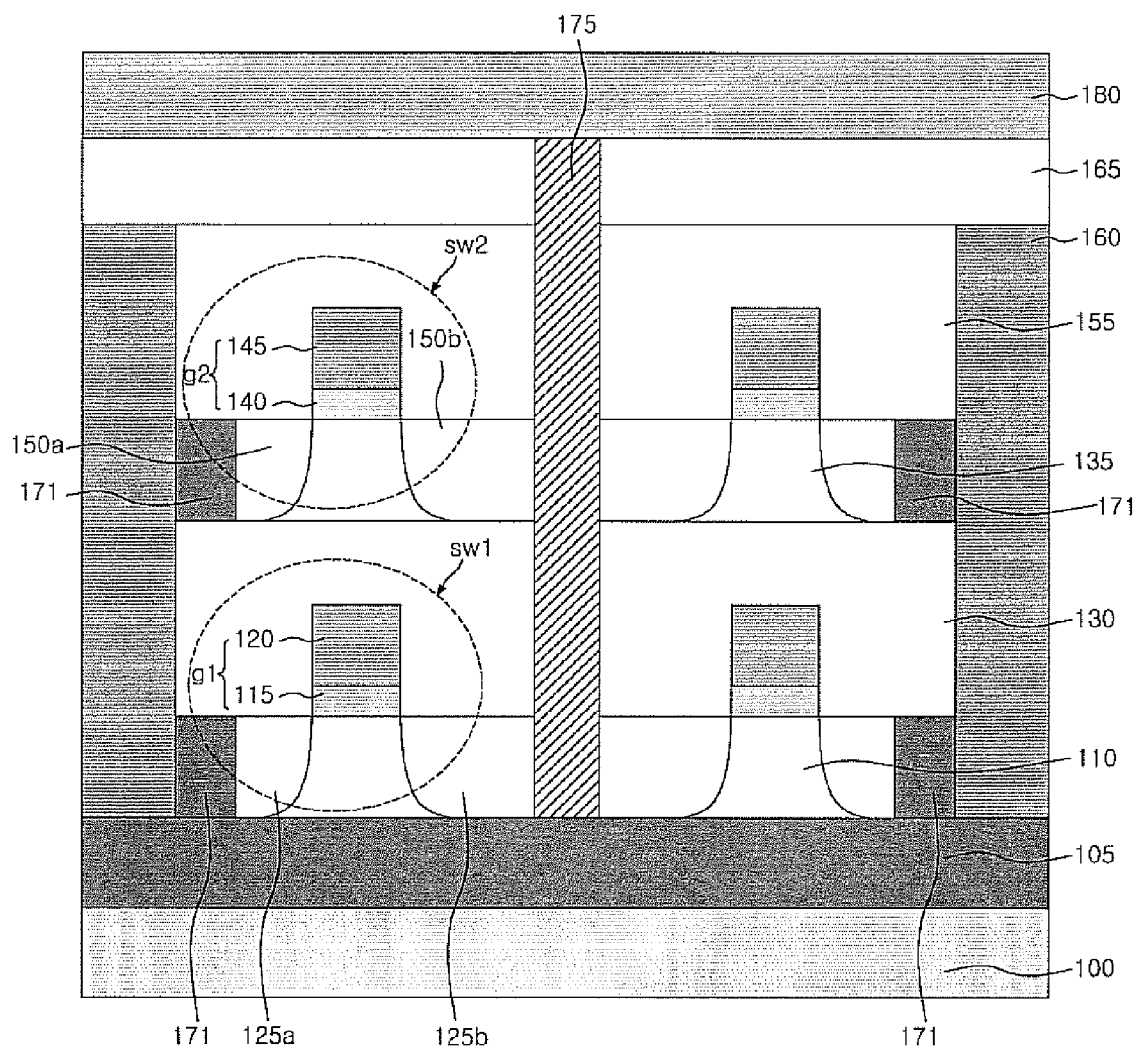

In addition, referring to FIG. 18, resistive device layers 171 may be formed between source regions 125a and 150a and a common source line 160. More specifically, after a process of forming a contact hole for forming the common source line 160 is performed, a pull-back process is performed on the source regions 125a and 150a to form a groove (not shown) in which the resistive device layer 171 is to be formed. Next, the resistive device layer 171 is formed in the groove and the common source line 160 is formed in the contact hole.

Figure 19:
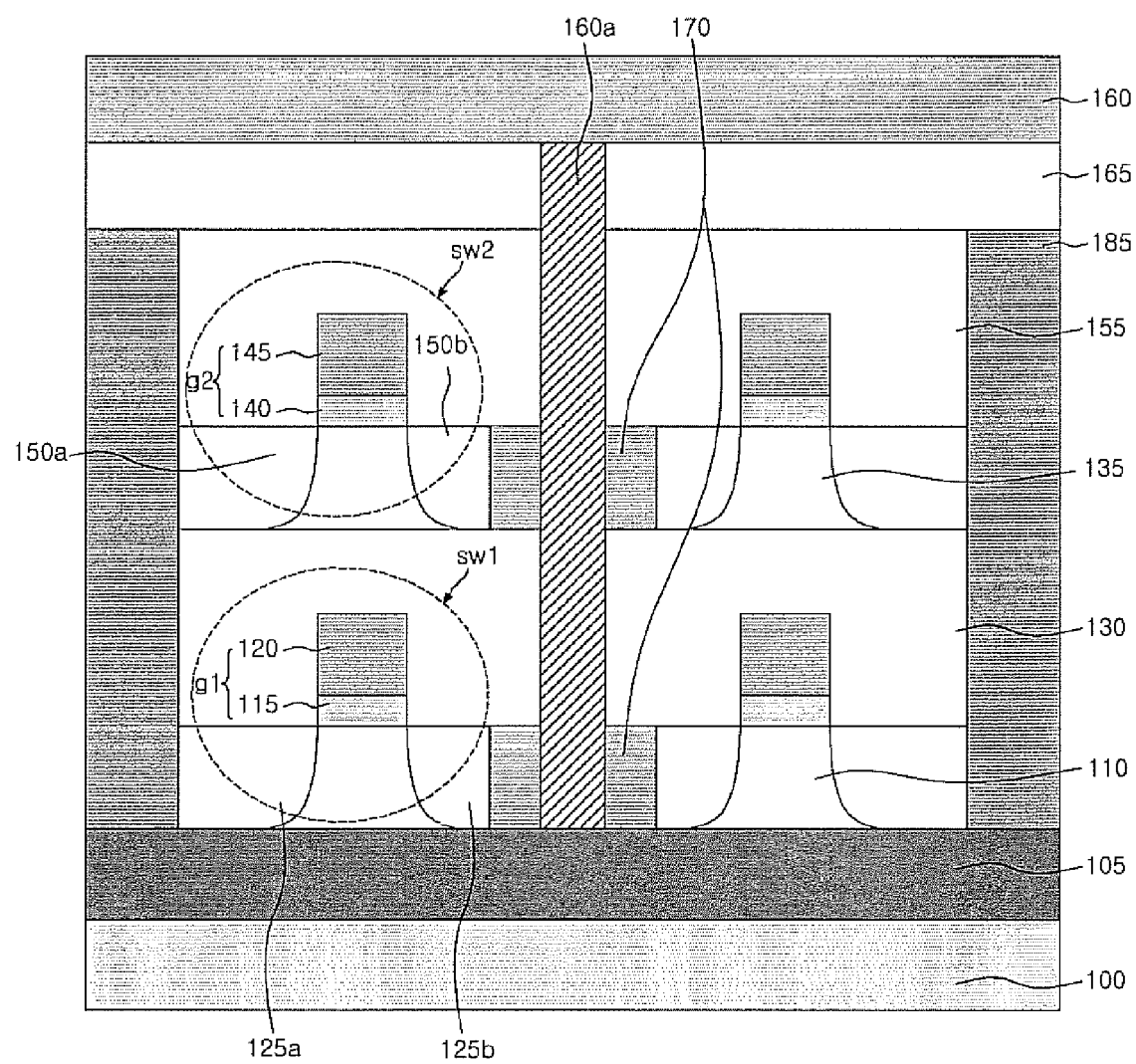

Referring to FIG. 19, a bit line 185 is arranged on one side of switching transistors SW1 and SW2 to be in contact with source regions 125a and 150a of the switching transistors SW1 and SW2 and a common source line 160 is formed to be electrically connected to drain regions 125b and 150b of the switching transistors SW1 and SW2. That is, the locations of the bit line 185 and the common source line 160 are switched from those in FIGS. 1, 17, and 18. Here, a plug 160a is a conductive plug which connects the drain regions 125b and 150b of the switching transistors SW1 and SW2 to the common source line 160. The conductive plug 160a extends perpendicular to a surface of a semiconductor substrate 100 so that a sidewall of the conductive plug 160a is in contact with the drain regions 125b and 150b.

Figure 20:
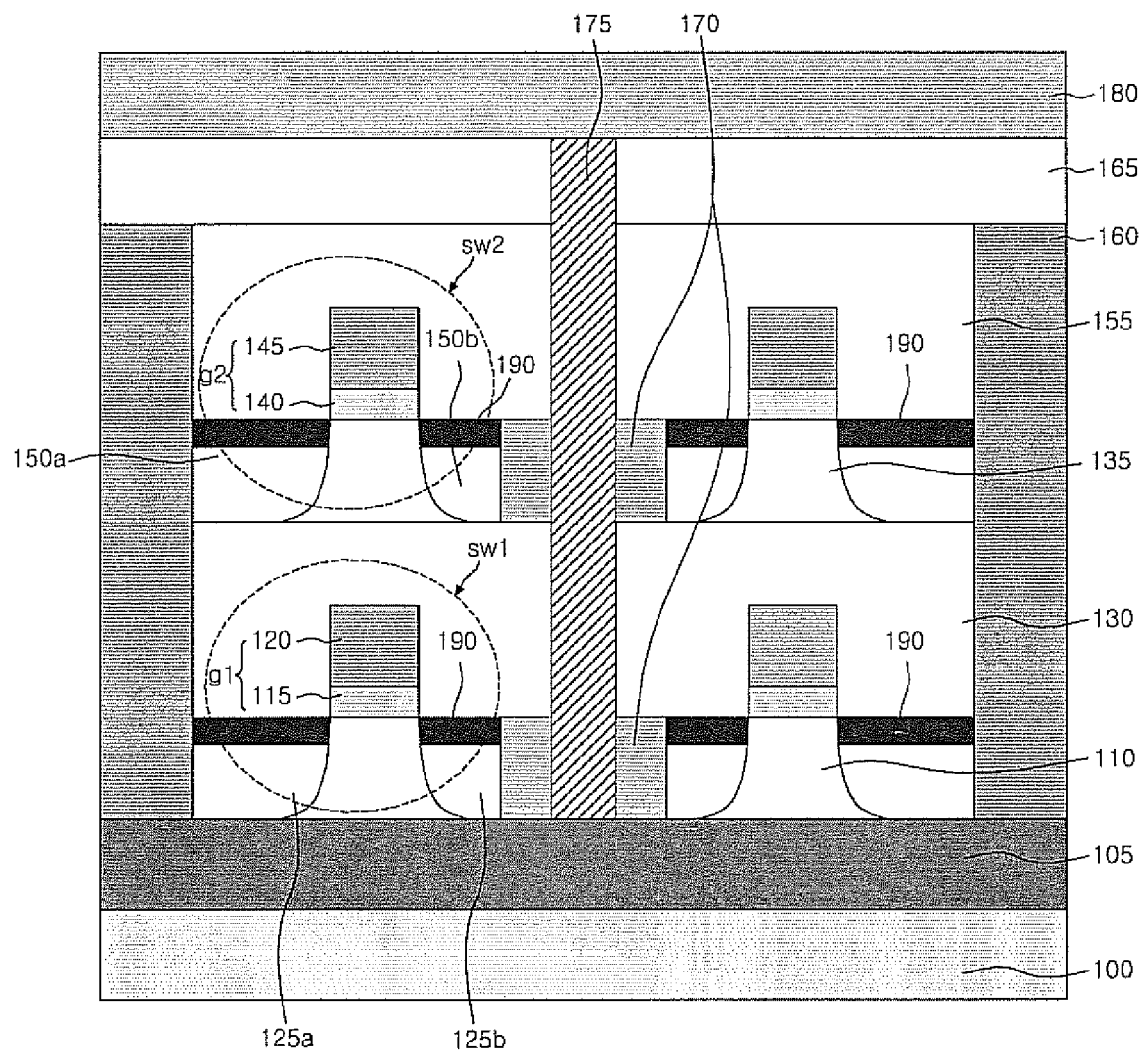

Referring to FIG. 20, silicide layers 190 are formed on source regions 125a and 150a and drain regions 125b and 150b, respectively, to increase current characteristics of switching transistors SW1 and SW2.

Figure 21:
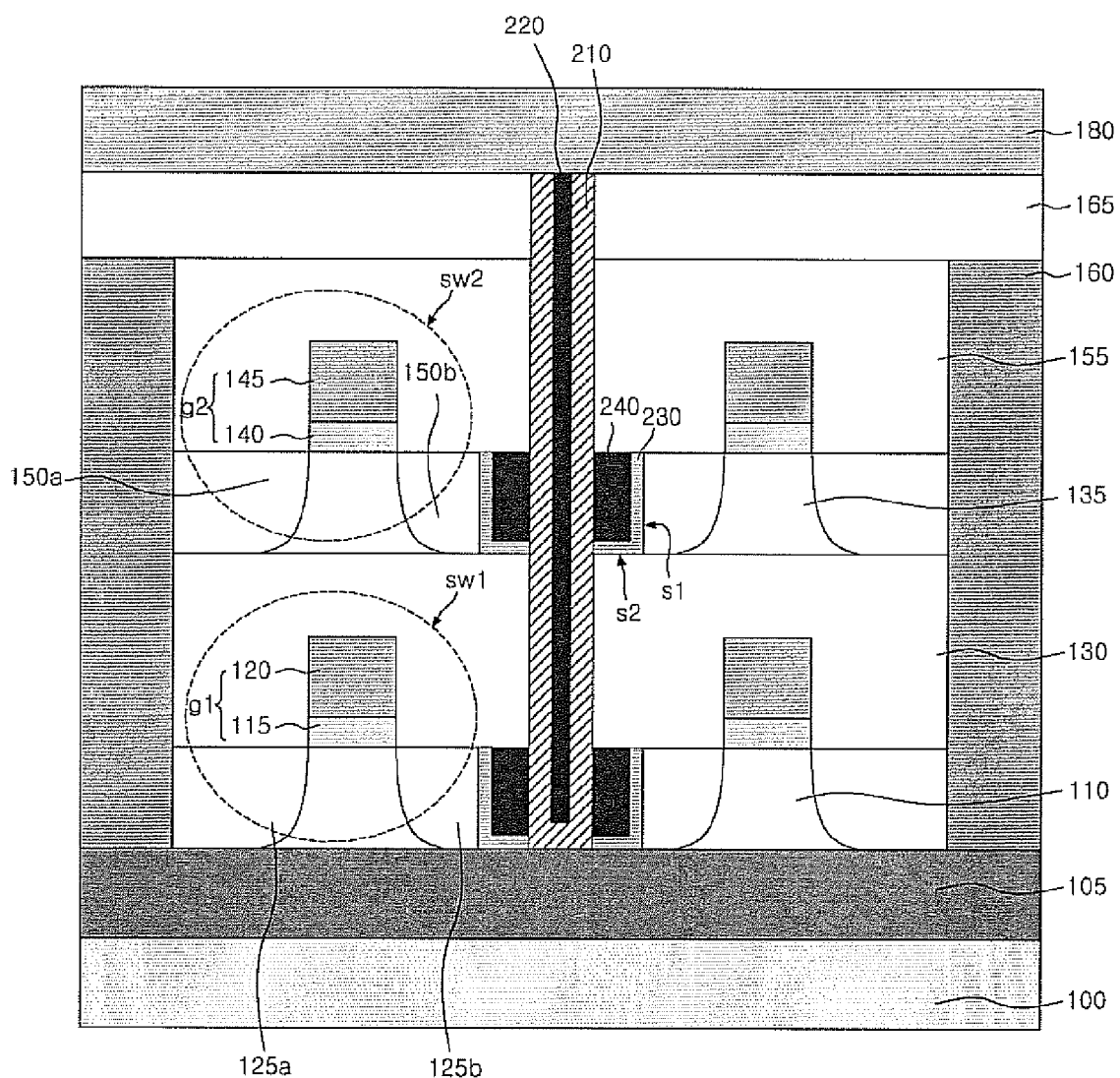
Figure 22:
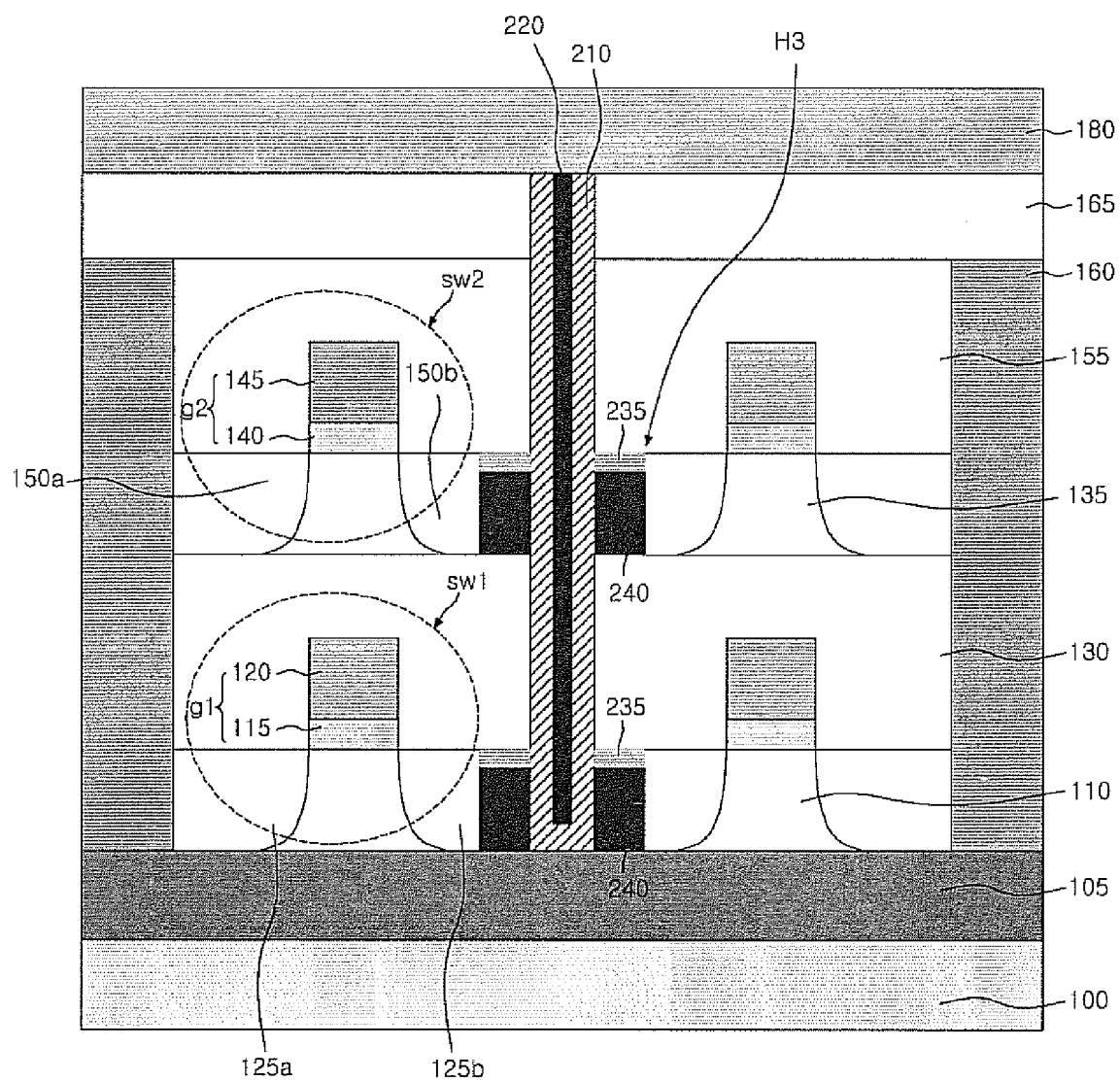

FIGS. 21 and 22 are cross-sectional views of phase-change memory devices according to other exemplary embodiments.

When the structure of the exemplary embodiment of the present invention is applied to a phase-change memory device, as shown in FIG. 21, a phase-change material layer 210 and an upper electrode 220 may be formed in a position in which the bit line contact unit 175 is formed in the above-described exemplary embodiments, that is, in the second contact hole H1 and a heating electrode 230 may be formed in the region in which the resistive device layer 170 is formed in the above-described exemplary embodiments, that is, the groove H2.

The phase-change material layer 210 is formed to cover an inner surface of the second contact hole H1 and the upper electrode 220 is formed to fill the second contact hole H1 of which the inner surface is surrounded by the phase-change material layer 210.

The heating electrode 230 may be formed on a sidewall s1 and a bottom s2 of the groove H2 to reduce a contact area with the phase-change material layer 210. For example, the heating electrode 230 may have an "L"-character shape and the groove H2 of the heating electrode 230 may be buried with an insulating material layer 240. By reducing the contact area between the heating electrode 230 and the phase-change material layer 210, a reset current characteristic of the phase-change memory device may be improved.

According to another example, as shown in FIG. 22, a heating electrode 235 may be formed only on an upper surface of a groove H3. That is, the groove H3 may be mostly filled with an insulating material layer 240 and the heating electrode 235 may be formed on the insulating material layer within the groove H3.

According to the exemplary embodiments, a plurality of memory cells can be integrated in a confined space by stacking resistive memory cells. Therefore, an integration density can be improved. In addition, MOS transistors are used as the switching transistors of the resistive memory cells and thus a current density can be increased.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A resistive memory device, comprising:
   a first resistive memory cell having a first switching transistor and a first resistive device layer electrically connected to the first switching transistor;
   a second resistive memory cell configured to be stacked on the first resistive memory cell and insulated from the first resistive memory cell by an insulating layer, wherein the second resistive memory cell includes a second switching transistor and a second resistive device layer electrically connected to the second switching transistor;
   a common source line electrically connected to the first and second resistive memory cells; and
   a bit line electrically connected to the first and second resistive device layers and being insulated from the common source line,
   wherein the insulating layer is positioned between the first and second resistive device layers.

2. The resistive memory device of claim 1, wherein each of the first and second switching transistors includes:
   an active layer having a line shape and formed on a semiconductor substrate;
   a gate electrode formed to overlap a surface of the active layer; and
   a source region and a drain region formed in the active layer at opposite sides of the gate electrode, respectively.

3. The resistive memory device of claim 2, wherein the gate electrode is formed to have a line structure extending in a direction crossing the active layer and surround an upper surface and at least one of lateral surfaces of the active layer.

4. The resistive memory device of claim 2, wherein the first resistive device layer is formed to be in contact with one side of the drain region of the first switching transistor, and the second resistive device layer is formed to be in contact with one side of the drain region of the second switching transistor.

5. The resistive memory device of claim 4, wherein the bit line is formed to be electrically connected to the first and second resistive device layers.

6. The resistive memory device of claim 4, wherein the bit line is formed in parallel to a surface of the semiconductor substrate,
   wherein the resistive memory device further comprising a bit line contact unit configured to directly connect the first and second resistive device layers and the bit line and extend perpendicularly to the surface of the semiconductor substrate which is located under the first resistive memory cell.

7. The resistive memory device of claim 2, wherein the first resistive device layer is formed between the source region of the first switching transistor and the common source line and the second resistive device layer is formed between the source region of the second switching transistor and the common source line.

8. The resistive memory device of claim 2, wherein the common source line is formed to extend perpendicularly to a surface of the semiconductor substrate which is located under the first resistive memory cell and be in contact with the source regions of the first and second switching transistors.

9. The resistive memory device of claim 2, wherein the common source line is formed to be in parallel to a surface of the semiconductor substrate,
   the resistive memory device further comprising a conductive plug that extends perpendicularly to the surface of the semiconductor substrate and connects the first and second resistive device layers to the common source line.

10. The resistive memory device of claim 2, further comprising silicide layers formed on surfaces of the source and drain regions of the first and second switching transistors.

11. The resistive memory device of claim 2, wherein the first and second resistive device layers include a phase-change material, respectively,
    wherein the resistive memory device further comprising heating electrodes formed between the drain region of the first switching transistor and the first resistive device layer and between the drain region of the second switching transistor and the second resistive device layer.

12. The resistive memory device of claim 11, further comprising an upper electrode surrounded by the first and second resistive device layers and arranged to be electrically connected to the bit line.

13. The resistive memory device of claim 2, further comprising a first heating electrode formed on the drain region of the first switching transistor with electrically connecting to the bit line and a second heating electrode formed on the drain of the second switching transistor with electrically connecting to the bit line.

14. The resistive memory device of claim 1, wherein the first and second resistive device layers include any one selected from the group consisting of a praseodymium calcium manganese oxide (PCMO) layer, a chalcogenide layer, a magnetic layer, a magnetization switching device layer, and a polymer layer.

15. A resistive memory device, comprising:
    a semiconductor substrate;
    a pair of first resistive memory cells formed on the semiconductor substrate;
    a first interlayer insulating layer formed on the pair of first resistive memory cells;
    a pair of second resistive memory cells formed on the first interlayer insulating layer at positions above the pair of first resistive memory cells;
    a common source line electrically connected to the first and second resistive memory cells; and
    a bit line electrically connected to the first and second resistive memory cells,
    wherein each of the first and second resistive memory cells includes a switching transistor and a resistive device layer connected to the switching transistor, and
    wherein the resistive device layers of the first memory cells are insulated from the resistive device layers of the second memory cells by the first interlayer insulating layer.

16. The resistive memory device of claim 15, wherein, in the pairs of the first and second resistive memory cells, each of the resistive device layers is formed to be in contact with a side of a drain of each of the switching transistors.

17. The resistive memory device of claim 16, further comprising a bit line contact unit penetrating between the pair of first resistive memory cells and between the pair of second resistive memory cells,
    wherein the bit line contact unit is connected to the resistive device layers of the switching transistors and the bit line.

18. The resistive memory device of claim 17, wherein the pair of first resistive memory cells and the pair of second resistive memory cells are symmetrically arranged with respect to the bit line contact unit.

19. The resistive memory device of claim 16, wherein the common source line is formed perpendicularly to a surface of the semiconductor substrate to be in contact with source regions of the switching transistors of the pairs of stacked first and second resistive memory cells.

20. The resistive memory device of claim 15, wherein each of the resistive device layers is formed to electrically connect a source region of a respective one of the switching transistors to the common source line.

21. The resistive memory device of claim 15, wherein the common source line is formed in parallel to a surface of the semiconductor substrate, the resistive memory device further comprising a conductive plug configured to penetrate between the pair of first resistive memory cells and between the pair of second resistive memory cells and electrically connect source regions of the switching transistors to the common source line.

22. The resistive memory device of claim 21, wherein the pair of first resistive memory cells and the pair of second resistive memory cells are symmetrically arranged with respect to the conductive plug.

23. The resistive memory device of claim 21, further comprising a heating electrode formed between the resistive device layer and a drain region of each of the switching transistors.

24. A method of manufacturing a resistive memory device, comprising:
forming a first active layer on a semiconductor substrate;
forming a first switching transistor in the first active layer;
forming a first interlayer insulating layer on a structure including the first active layer;
forming a second active layer on the first interlayer insulating layer;
forming a second switching transistor in the second active layer;
forming a common source line to be in contact with source regions of the first and second switching transistors;
forming a second interlayer insulating layer on a structure including the common source line;
etching a predetermined portion of the second interlayer insulating layer, the second active layer, the first interlayer insulating layer, and the first active layer to form a contact hole:
over-etching the first and second active layers exposed by the contact hole to form grooves;
forming a resistive device layer in the grooves;
forming a bit line contact unit in the contact hole and to be in contact with the resistive device layer; and
forming a bit line on the second interlayer insulating layer to be connected to the bit line contact unit.

\* \* \* \* \*